United States Patent
Mohan et al.

(10) Patent No.: US 11,971,463 B2
(45) Date of Patent: Apr. 30, 2024

(54) TEMPERATURE COMPENSATED MTJ-BASED SENSING CIRCUIT FOR MEASURING AN EXTERNAL MAGNETIC FIELD

(71) Applicant: Allegro MicroSystems, LLC, Manchester, NH (US)

(72) Inventors: Anuraag Mohan, Fremont, CA (US); Robert Zucker, Half Moon Bay, CA (US)

(73) Assignee: Allegro MicroSystems, LLC, Manchester, NH (US)

( * ) Notice: Subject to any disclaimer, the term of this patent is extended or adjusted under 35 U.S.C. 154(b) by 98 days.

(21) Appl. No.: 17/905,214

(22) PCT Filed: Feb. 22, 2021

(86) PCT No.: PCT/IB2021/051475
§ 371 (c)(1),
(2) Date: Aug. 29, 2022

(87) PCT Pub. No.: WO2021/176296
PCT Pub. Date: Sep. 10, 2021

(65) Prior Publication Data
US 2023/0119854 A1    Apr. 20, 2023

Related U.S. Application Data

(60) Provisional application No. 62/983,809, filed on Mar. 2, 2020.

(51) Int. Cl.
G01R 33/09    (2006.01)
G01R 1/04     (2006.01)
(Continued)

(52) U.S. Cl.
CPC ....... G01R 33/098 (2013.01); G01R 33/0082 (2013.01)

(58) Field of Classification Search
CPC ........ G01R 33/00; G01R 33/02; G01R 33/07; G01R 33/09; G01R 1/02; G01R 1/04;
(Continued)

(56) References Cited

U.S. PATENT DOCUMENTS

| | | | |
|---|---|---|---|
| 2018/0017637 A1* | 1/2018 | Cesaretti | G01R 33/07 |
| 2019/0154735 A1 | 5/2019 | Shimizu et al. | |
| 2019/0339337 A1 | 11/2019 | Sharma et al. | |

FOREIGN PATENT DOCUMENTS

| | | |
|---|---|---|
| EP | 3457154 A1 | 3/2019 |
| EP | 3467522 A1 | 4/2019 |

OTHER PUBLICATIONS

International Search Report for issued in Application No. PCT/IB2021/051475 dated May 21, 2021.
Written Opinion for PCT/IB2021/051475 dated May 21, 2021.

* cited by examiner

*Primary Examiner* — Neel D Shah
(74) *Attorney, Agent, or Firm* — DALY, CROWLEY, MOFFORD & DURKEE, LLP (57) ABSTRACT

Disclosed is a MTJ sensing circuit for measuring an external magnetic field and including a plurality of MTJ sensor elements connected in a bridge configuration, the MTJ sensing circuit having an input for inputting a bias voltage and generating an output voltage proportional to the external magnetic field multiplied by the bias voltage and a gain sensitivity of the MTJ sensing circuit, wherein the gain sensitivity and the output voltage vary with temperature; the MTJ sensing circuit further including a temperature compensation circuit configured to provide a modulated bias voltage that varies as a function of temperature over a
(Continued)

temperature range, such that the output voltage is substantially constant as a function of temperature. Also disclosed is a method for compensating the output voltage for temperature.

6 Claims, 7 Drawing Sheets (51) Int. Cl.
    *G01R 1/067*     (2006.01)
    *G01R 1/073*     (2006.01)
    *G01R 15/20*     (2006.01)
    *G01R 19/32*     (2006.01)
    *G01R 33/00*     (2006.01)
    *G01R 33/02*     (2006.01)
    *G01R 33/07*     (2006.01)
    *G01R 35/00*     (2006.01)
(58) Field of Classification Search
    CPC .......... G01R 1/067; G01R 1/073; G01R 1/20;
                   G01R 15/20; G01R 35/00; G01R 19/32
    See application file for complete search history.

TEMPERATURE COMPENSATED MTJ-BASED SENSING CIRCUIT FOR MEASURING AN EXTERNAL MAGNETIC FIELD

RELATED APPLICATION

This application is a national phase of PCT/IB2021/051475 filed on Feb. 22, 2021, which claims U.S. Provisional Application No. 62/983,809, filed on Mar. 2, 2020. The entire contents of these applications are hereby incorporated by reference in their entireties.

FIELD

This invention relates generally to magnetic sensors employing magnetic tunnel junctions. More particularly, this invention is directed toward magnetic sensor output compensation based upon temperature of the magnetic sensor.

BACKGROUND

Figure 1:
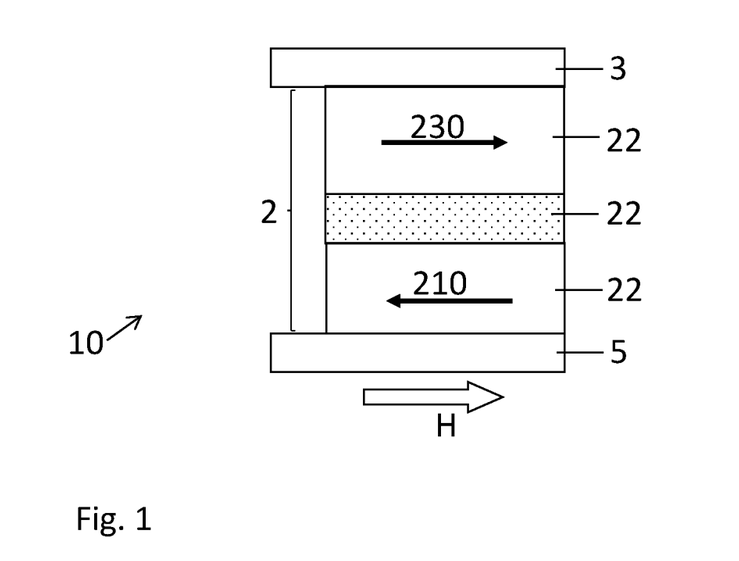
FIG. 1 shows a schematic cross section diagram of a MTJ sensing element.

FIG. 1 shows a schematic cross section diagram of the magnetic tunnel junction (MTJ) sensing element 10. The term MTJ is used to refer to a tunnel magnetoresistance (TMR) sensing element. The MTJ sensing element 10 comprises a tunnel barrier layer 22 sandwiched between a sense ferromagnetic layer 21 having a sense magnetization 210 and a pinned ferromagnetic layer 23 having a pinned magnetization 230. The sense magnetization 210 is configured to be orientable in an external magnetic field 42 while the orientation of the pinned magnetization 230 remain unchanged. In such configuration, the external magnetic field H can be used to switch the sense magnetization 210 from an orientation parallel to the pinned magnetization 230 to an orientation antiparallel to the pinned magnetization 230, or vice-versa.

Figure 2:
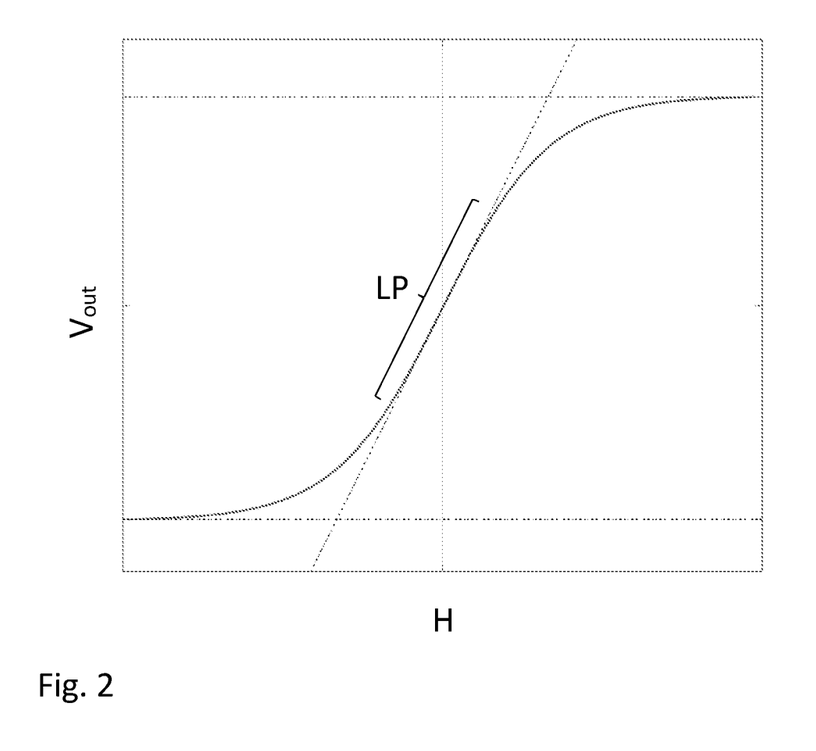
FIG. 2 shows a response curve of resistance versus the external magnetic field for the MTJ sensing element.

FIG. 2 shows a response curve of resistance R versus the external magnetic field H. The magnetoresistance response curve shows the resistance change as a function of the angle between the directions of the sense magnetization 210 and the pinned magnetization 230. When the sense magnetization 210 is parallel to the pinned magnetization 230 the resistance of the MRAM cell 10 is low (logic state "0"). When the sense magnetization 210 is antiparallel to the pinned magnetization 230 the resistance of the MRAM cell 10 is high (logic state "1"). When the sense and pinned magnetizations 210, 230 are at a perpendicular angle, the resistance is at a value halfway between the high and low resistance. Around this value, the MTJ sensing element 10 has a linear response. The slope of the linear portion LP of the response curve is proportional to the sensitivity of the MTJ sensing element 10.

Relative to a Hall effect element and GMR sensing element, an MTJ sensor element has better temperature stability, higher sensitivity, lower power consumption, better linearity, and needs no additional flux concentrator structure. Relative to an AMR element, an MTJ sensor element has wider linear range, and needs no set/reset coil.

A resistance bridge is often employed in a circuit application to change the response signal of the MTJ sensing element 10, so that its output voltage is easy to amplify. This can also reduce common-mode signals, provide noise cancellation, reduce temperature drift, and minimize other transducer deficiencies. The MTJ sensing element 10 can be connected in parallel and/or in series to form a Wheatstone bridge or any other type of circuit bridge.

Figure 3:
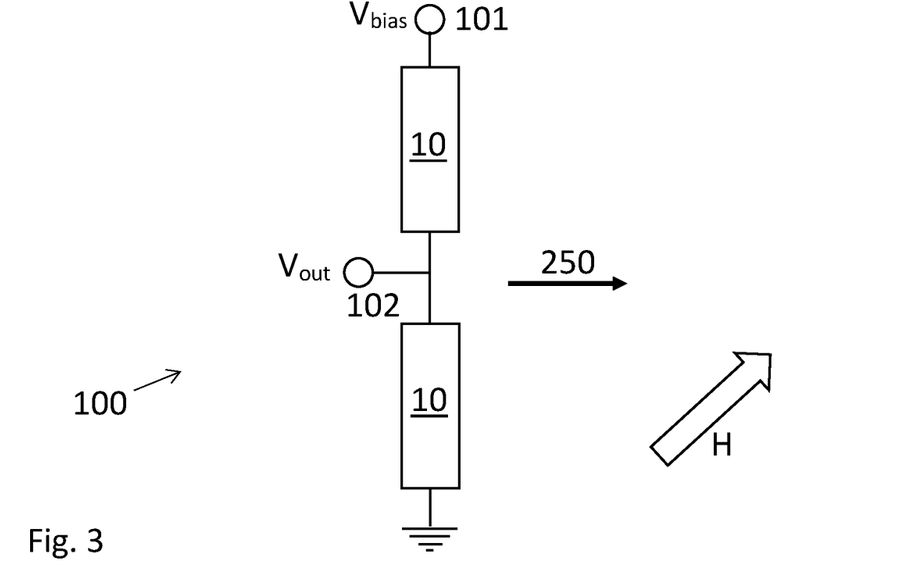
FIG. 3 shows a half-bridge MTJ sensing circuit.

FIG. 3 shows a half-bridge MTJ sensing circuit 100. One of the two MTJ sensing element 10 can have its pinned magnetization 230 that is rotated orthogonal to the pinned magnetization 23 of the other MTJ sensing element 10. The sensing axis 250 of the MTJ sensing circuit 100 coincides with the pinned magnetization 230 direction of the top MTJ sensing element 10.

Figure 4:
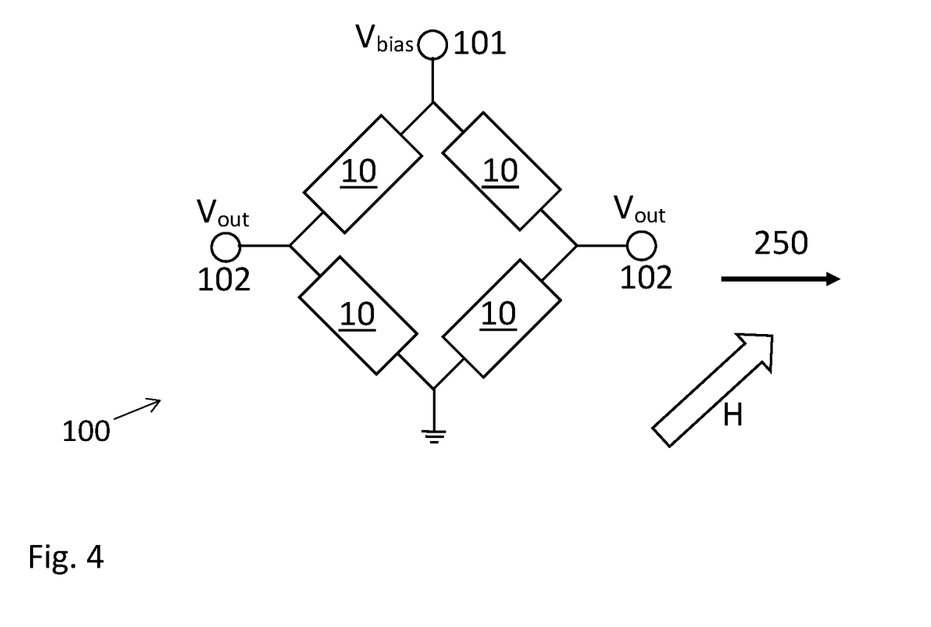
FIG. 4 shows a full-bridge MTJ sensing circuit.

The MTJ sensing circuit 100 can also be arranged as a full (Wheatstone)-bridge circuit configuration comprising two MTJ sensing element 10 connected in series in parallel to two other MTJ sensing element 10 connected in series, such as shown in FIG. 4.

The MTJ sensing circuit 100 has three external contact pads, namely an input 101 where a bias voltage $V_{bias}$ is inputted, an output 102 where an output voltage $V_{out}$ and a ground. For a given value of external magnetic field H, along the positive sensing axis 250, the resistance increases for one (or two) MTJ sensing element 10 and decreases for the (two) other. When the external magnetic field H is applied in the opposite direction (along the negative sensing axis 250) the resistance decreases for one (or two) while increasing for the (two) other.

The output voltage $V_{out}$ of the MTJ sensing circuit 100 can be measured using many typical methods. For example, a voltmeter is connected between $V_{out}$ and ground, and the $V_{out}$ and ground potential difference is the output voltage.

The sensitivity of magnetic sensors is expressed as a ratio of mV/mTN$_{bias}$. This defines the change in output voltage $V_{out}$ of the MTJ sensing circuit 100 for a change in the external magnetic field H. The sensitivity of the MTJ sensing element 10, and of the MTJ sensing circuit 100, is ratiometric and is directly proportional to the bias voltage $V_{bias}$. The output voltage $V_{out}$ of the MTJ sensing circuit 100 can be expressed as:

$$V_{out}(mV) = G * H(mT) * V_{bias}, \quad (1)$$

where G is the gain (in mV/mT/$V_{bias}$).

Operating the MTJ sensing circuit 100 across a wide temperature range leads to thermally induced variations of sensitivity, thereby impeding the accuracy of the MTJ sensing circuit. The operating temperature of the MTJ sensing circuit 100 can vary significantly, in some cases from −40° C. to +155° C. Changes in temperature also change the sensitivity of the MTJ sensing circuit 100. Variations of sensitivity can be proportional to temperature with a linear slope, or of a higher order curve. Temperature coefficient of sensitivity can be as high as 500 ppm/C.

Figure 5:
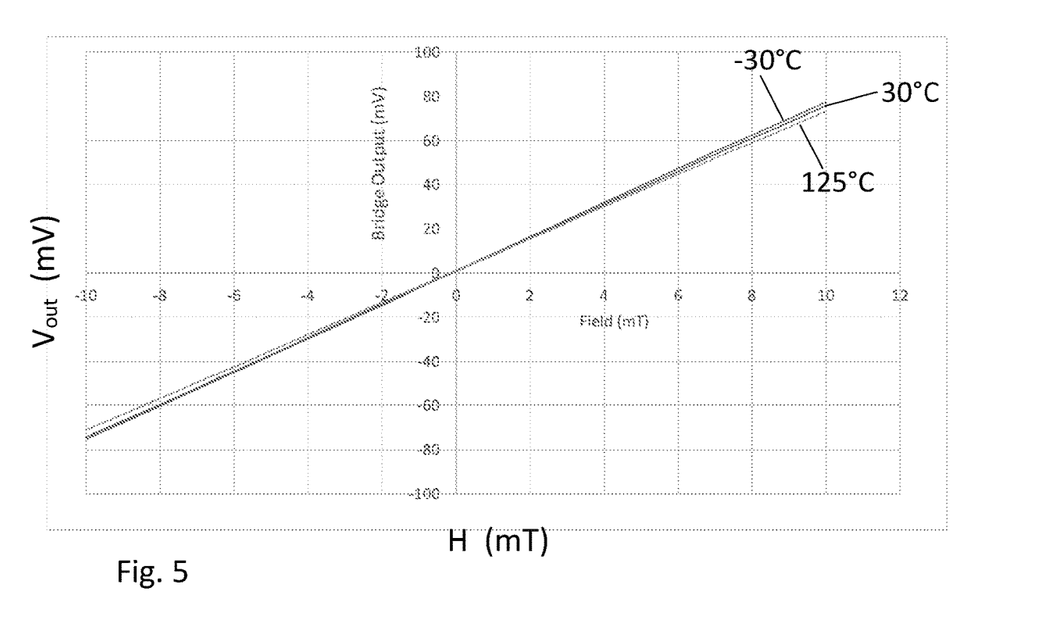
FIG. 5 shows response curves of the half-bridge MTJ sensing circuit measured in the linear portion.

FIG. 5 shows response curves of the half-bridge MTJ sensing circuit 100 measured in the linear portion. In particular, FIG. 4 shows response curves measured at three different temperatures, −30° C., 30° C. and 125° C.

Operating the sensor across a wide temperature range leads to thermally induced variations of sensitivity, thereby impeding the accuracy of sensors. In some cases, the output drift can vary by 5%. Thus, there is a need for thermal compensation of the output of magnetic sensors.

SUMMARY

The present disclosure concerns a MTJ sensing circuit for measuring an external magnetic field and comprising a plurality of MTJ sensor elements connected in a bridge configuration, the MTJ sensing circuit having an input for inputting a bias voltage and generating an output voltage proportional to the external magnetic field multiplied by the bias voltage and a gain sensitivity of the MTJ sensing circuit, wherein the gain sensitivity and the output voltage vary with temperature; the MTJ sensing circuit further comprising a temperature compensation circuit configured to provide a modulated bias voltage that varies as a function of temperature over a temperature range, such that the output voltage is substantially constant as a function of temperature.

The present disclosure further concerns a method for compensating the output voltage for temperature variations.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

It is possible to have temperature variations that are proportional to temperature with a linear slope, or a higher order curve.

The gain sensitivity G(t) varies as a function of temperature T as:

$$G(T)=f(T), \quad (2)$$

where f(T) is a linear temperature function or a higher order temperature function.

In an embodiment, a method for measuring a temperature compensated external magnetic field H using the MTJ sensing circuit 100 comprises a step of modulating the bias voltage $V_{bias}$ with temperature T such that the modulated bias voltage $V_{bias}(T)$ multiplied by the gain sensitivity G(T) is constant:

$$V_{bias}(T) \times G(T) = \text{Constant} \quad (3).$$

The method further comprises a step of providing the modulated bias voltage $V_{bias}(T)$ in the input 101 of the MTJ sensing circuit 100 and measuring the output voltage $V_{out}$, provided at the output 102.

Providing the modulated bias voltage $V_{bias}(T)$ allows for the MTJ sensing circuit 100 to output the output voltage $V_{out}$ that varies with the external magnetic field H but that is substantially constant when the temperature T is varied.

The method further comprises a step of measuring the temperature T of the MTJ sensing circuit 100 and providing a correction temperature signal 30 (see FIG. 10) that is proportional to the temperature T of the MTJ sensing circuit 100.

The method further comprises a step of generating a bias voltage $V_{bias}$ and using the correction temperature signal to modulate the generated bias voltage $V_{bias}$ and provide the modulated bias voltage $V_{bias}(T)$. The modulated bias voltage $V_{bias}(T)$ is provided by using the correction temperature signal in combination with a temperature function f(T) such as a linear slope, or a higher order curve.

Figure 6:
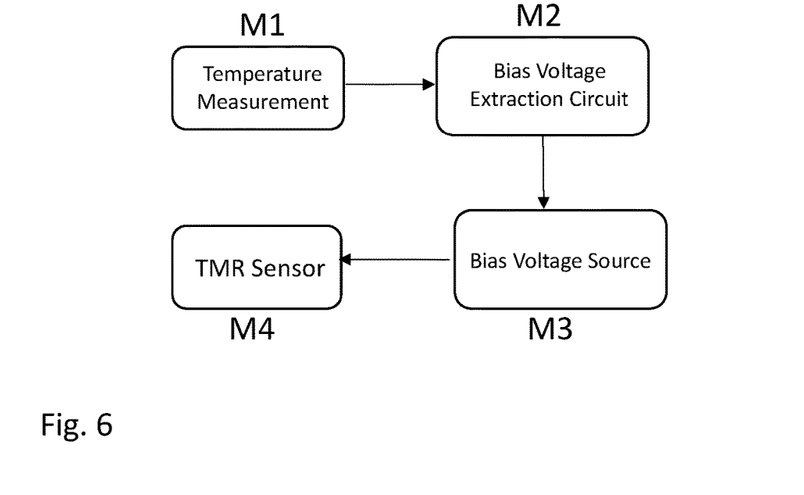
FIG. 6 schematically represents the method steps for measuring a temperature compensated external magnetic field, according to an embodiment.

FIG. 6 schematically represents the method steps, in particular, the steps of measuring the temperature T of the MTJ sensing circuit 100 (M1); generating a bias voltage $V_{bias}$ (M2); providing the modulated bias voltage $V_{bias}(T)$ (M3); and inputting the modulated bias voltage $V_{bias}(T)$ in the input 101 of the MTJ sensing circuit 100 (M4).

The steps of measuring the temperature of the MTJ sensing circuit 100, generating a bias voltage $V_{bias}$ and providing the modulated bias voltage $V_{bias}(T)$ can be performed using an analog circuitry to compensate for thermal variations.

Figure 7:
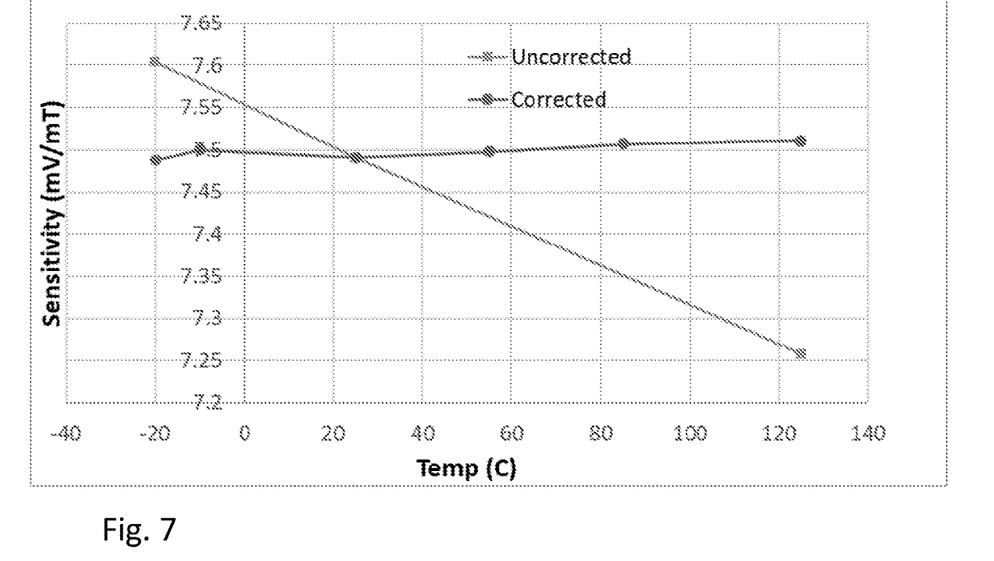
FIG. 7 report the gain sensitivity in the MTJ sensing circuit and being corrected for temperature variation according to the method disclosed herein.

FIG. 7 report the gain sensitivity G(t) in the MTJ sensing circuit 100 and being corrected for temperature variation according to the method disclosed herein. The corrected gain sensitivity G(t) is substantially independent of temperature variations (compensating the loss in the sensitivity G(T)).

Figure 8:
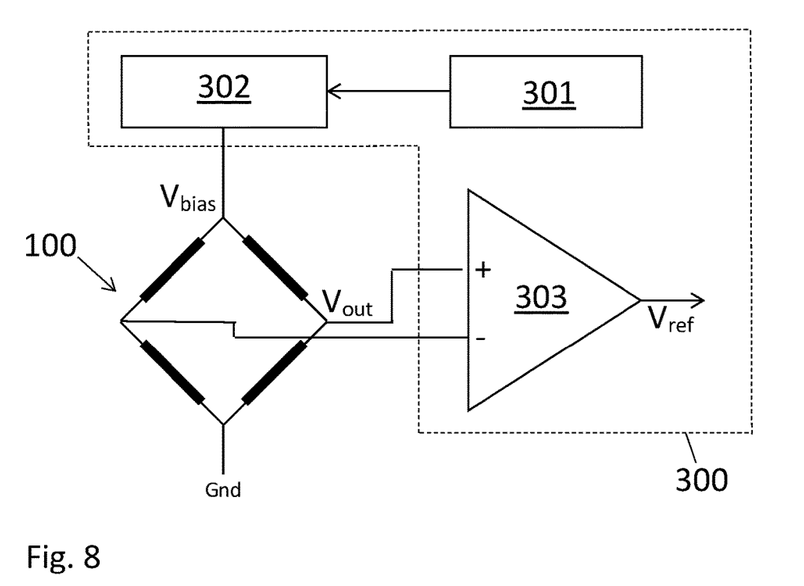
FIG. 8 illustrates a correction circuit, according to an embodiment.

FIG. 8 illustrates a correction circuit for compensating the output voltage $V_{out}$ of the MTJ sensing circuit 100 for temperature variations, according to an embodiment. The correction circuit 300 comprises a temperature sensor circuit 301 (reference generator) configured for generating a voltage reference $V_{ref}$ that is proportional to temperature T. The correction circuit 300 further comprises a bias voltage control circuit 302 (MTJ sensing circuit regulator) configured for providing the modulated bias voltage $V_{bias}(T)$ to the MTJ sensing circuit 100. The correction circuit 300 also comprises an analog front-end amplifier 303 in which the output voltage $V_{out}$ is inputted. The correction circuit 300 can be designed as a CMOS on-chip device.

Generally, the MTJ sensing circuit 100 has a sensitivity G(T) that is subject to a monotonically decreasing function as temperature T increases. More particularly, the sensitivity G(T) varies more strongly with temperatures below 25° C. and varies less with temperatures above 25° C. Thus, the temperature function f(T) of the sensitivity G(T) is not linear with temperature.

In an embodiment, a constant (non-modulated) bias voltage $V_{bias}$ is inputted in the MTJ sensing circuit 100. The sensitivity G(T) of the MTJ sensing circuit 100 is then measured over a range of temperatures T at fixed intervals. The sensitivity G(T) corresponds to mV/V/mT, i.e., mV of output $V_{out}$ for V of bias voltage $V_{bias}$ for mT of applied magnetic field. The measured sensitivity G(T) is then tabulated and normalized to 25° C. such as to obtain normalized coefficients for each interval. The normalized coefficients are then inverted and used to scale the bias voltage $V_{bias}$. The result yields a flat sensitivity G(T) over temperature T.

In another embodiment, the output voltage $V_{out}$ is multiplied with a linear temperature function f(T) such that the output voltage $V_{out}$ is increased with increasing temperature, yielding a flat sensitivity G(T) over temperature, in other words, compensating the loss in the sensitivity G(T). The linear temperature function f(T) can be based on a first order curve fit.

In yet another embodiment, the bias voltage $V_{bias}$ is varied with a positive temperature slope that is complementary to the loss in the sensitivity G(T) with temperature. In this configuration, the MTJ sensing circuit 100 is used as a multiplier that scales the output voltage $V_{out}$ according to the bias voltage $V_{bias}$.

This configuration can be implemented by biasing MTJ sensing circuit 100 with an adjustable temperature independent voltage mixed with a temperature dependent voltage that is proportional to absolute temperature (PTAT).

Figure 9:
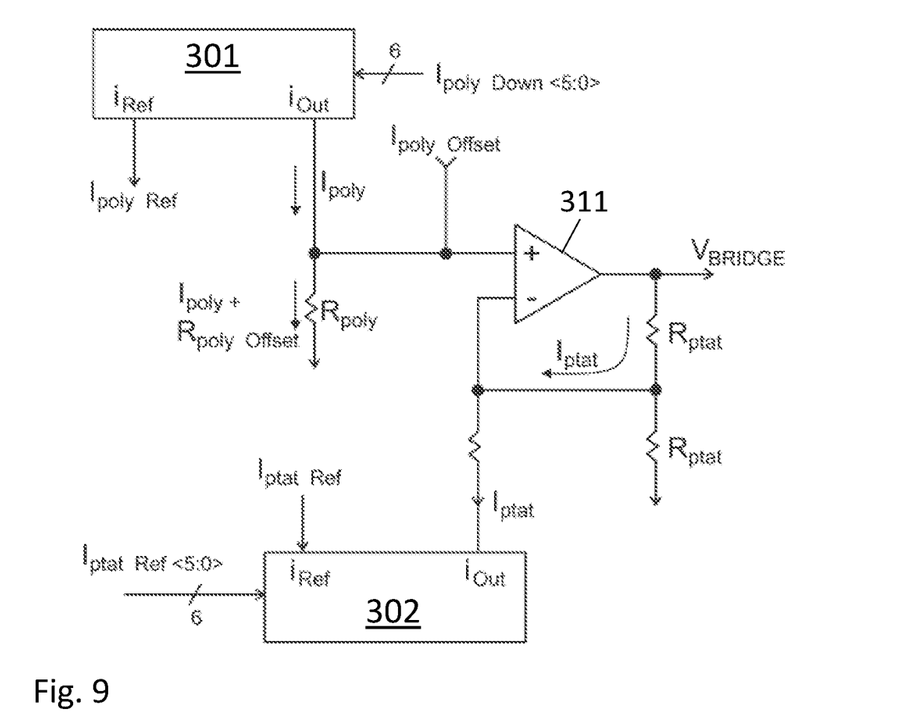
FIG. 9 shows a temperature sensor circuit, according to an embodiment.

More particularly, the temperature sensor circuit 301 (reference generator) is combined with the bias voltage control circuit 302 (MTJ sensing circuit regulator) into one stage of circuitry (see FIG. 9) that uses a single operational amplifier. The inputs to this stage are a combination of temperature-independent currents ($I_{poly\_Down}$) and PTAT currents ($I_{ptatRef}$). The stage contains an array of selectable current mirrors (current DAC) that act as a DAC, scaling the two current sources ($I_{polyoffset}$, $I_{ptat}$) which are injected into the operational amplifier circuit which converts the currents to voltages which are summed together to generate the desired temperature dependent output reference ($V_{bias}$). A 5 bit code adjusts the fixed component of the bias voltage $V_{bias}$ while another 5 bit code adjusts the PTAT component of the bias voltage $V_{bias}$. Both PTAT and fixed voltages are required since using a PTAT by itself is not possible. Indeed, for PTAT voltages, the stronger the slope is, the larger the voltage at 25° C. Voltage and slope are dependent functions.

In yet another embodiment, the linear temperature function f(T) comprises two different slopes, namely a first slope for temperatures T below 25° C. and a second slope for temperatures T equal or above 25° C. The two-slope linear temperature function f(T) allows for better, more effective, temperature compensation.

Figure 10:
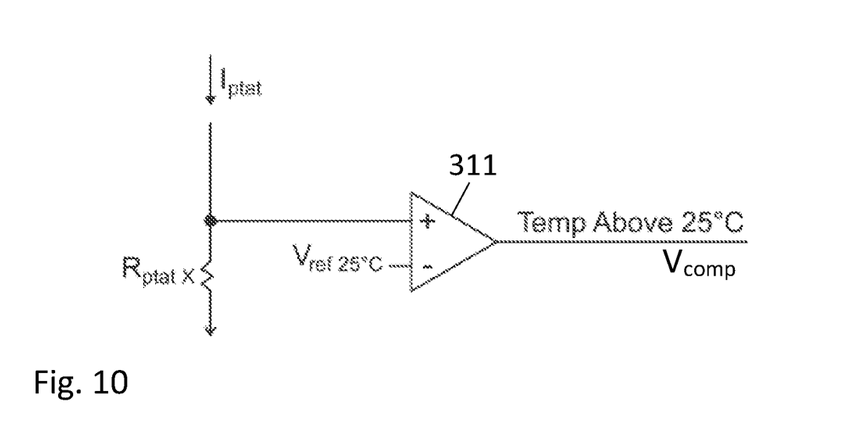
FIG. 10 shows a temperature sensor circuit, according to another embodiment.

This embodiment can be implemented similarly as for the third variant, but for two different slopes of the temperature function f(T). FIG. 10 shows how a PTAT current $I_{ptat}$ into a resistor $R_{ptatx}$ is used to determine the IC temperature T. The voltage across the resistor $R_{ptatx}$ directly scales with temperature T in degrees Kelvin. Putting a comparator 311 on this temperature dependent voltage allows the selection of two different pairs of 5 bit codes for the current DACs that change its compensation slope when the temperature transitions through 25° C.

A dual slope approximation to the ideal correction curve can be implemented. Adding filtering to the output of the bias voltage control circuit 302 (regulator output) can help reduce glitching during the transition. The comparator 311 has hysteresis to avoid chattering near the transition. The circuitry of FIG. 11 can still be used, but now the two pairs of 5 bit codes are changed when the temperature crosses 25° C. The number of bits is not necessarily 5 (for example it can be 6bits), this is specific to the specifications required for the implementation. A two-way digital multiplexer (not shown) that is triggered by the comparator output $V_{comp}$ (labelled "TempAbove25c" in FIG. 12) selects between two different pairs of digital numbers stored in a memory or is hard-wired.

In yet another embodiment, the loss in the sensitivity G(T) with temperature is characterized for several temperature subranges. For each temperature subrange, a reference voltage $V_{ref}$ is defined and inputted in the bias amplifier of the MTJ sensing circuit 100, wherein the reference voltage $V_{ref}$ changes for each temperature subrange according to a digital look up table (LUT). For example, for the temperature range of −40° C. to 125° C., a reference voltage $V_{ref}$ and a bias voltage $V_{bias}$ is defined for each temperature subrange of 10° C. The temperature subrange does not need to be 10° C. but can have any suitable value, such as 20° C., 30° C., etc., depending on the degree of accuracy one wishes to have for the temperature compensation of the MTJ sensing circuit 100.

To improve the compensation scheme by accounting for the non-linearity of the sensitivity versus the temperature curve, a piecewise linear approximation of the ideal inverse of the temperature sensitivity profile can be implemented. In the illustrated example in FIG. 11, the temperature range from −40° C. to 125° C. is broken into 16 temperature subranges of 10° C. A plurality of temperature dependent voltages $V_{-Ti}$(V−40° C., V−30° C., ... V110° C., V120° C.) are generated by forcing a PTAT current $I_{ptat}$ into the resistor string comprising a plurality of subrange resistors $R_{ptat\_i}$ (one subrange resistor $R_{ptat\_i}$ for each temperature dependent voltages). The temperature dependent voltages $V_{-Ti}$ are compared pairwise to a plurality of fixed voltage references $V_{Ref\_Ti}$ ($V_{ref}$−30° C., $V_{ref}$−20° C., $V_{ref}$110° C., Vef120° C.) in a plurality of comparators 312, resulting in a plurality of hysteresis comparator outputs $T_{aboveM3\_Ti}$($T_{aboveM30°\ C.}$, $T_{aboveM20°\ C.}$, ... $T_{aboveM110°\ C.}$, $T_{aboveM120°\ C.}$).

Figure 11:
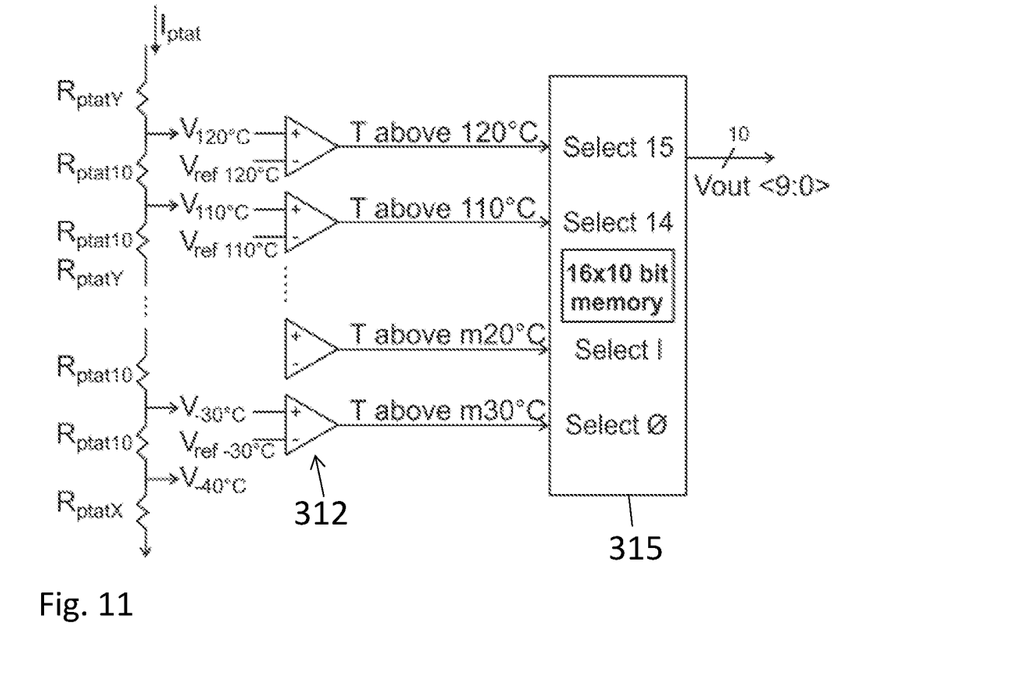
FIG. 11 shows a temperature sensor circuit, according to yet another embodiment.

The plurality of hysteresis comparator outputs $T_{aboveM3\_Ti}$ are connected to an array-based memory cell 315 that selects between 16 memory locations priority encoded based on the highest logic HI input (Select0, Select1, Select14, Select15). The array-based memory cell 315 has 16 registers, each register digitally representing the desired analog bias voltage $V_{bias}$ of the MTJ sensing circuit 100.

Figure 12:
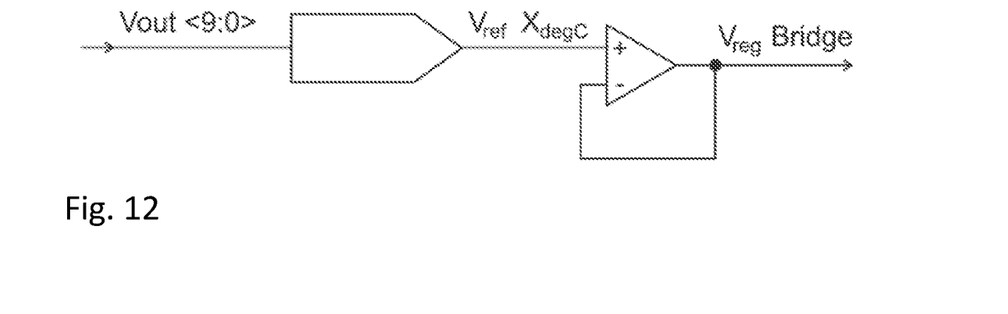
FIG. 12 shows a temperature sensor circuit, according to yet another embodiment.

FIG. 12 shows a DAC that converts the 16 digital codes into a voltage reference $V_{Ref\_Ti}$ for the temperature sensor circuit 301 that changes every 10° C. The exact number of registers and temperature subranges is adjustable, and dependent on the required resolution of temperature compensation.

In an alternative configuration, a pair of comparators 312 window a 10° C. span of temperature. The pair of comparators 312 can be arranged such that the window span is moved to different temperature positions based on a measured temperature. In such configuration, only two comparators 312 are required, for any number of temperature subranges that are required.

Figure 13:
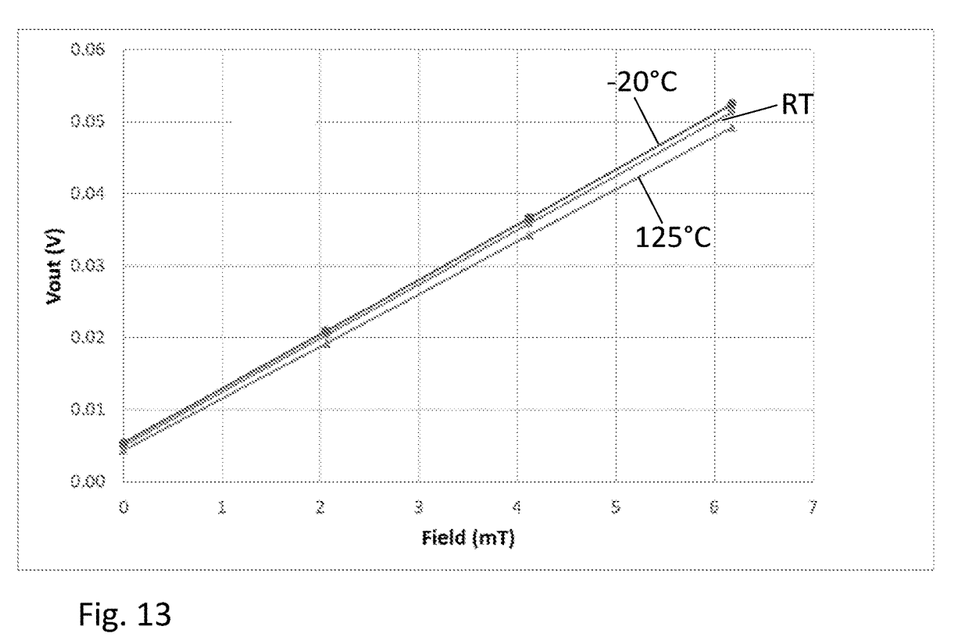
FIG. 13 shows response curves of the MTJ sensing circuit, wherein the bias voltage is not modulated with temperature.

FIG. 13 shows response curves of the MTJ sensing circuit 100 measured in the linear portion at room temperature RT, 125° C. and −20° C., wherein the bias voltage $V_{bias}$ is not modulated with temperature.

Figure 14:
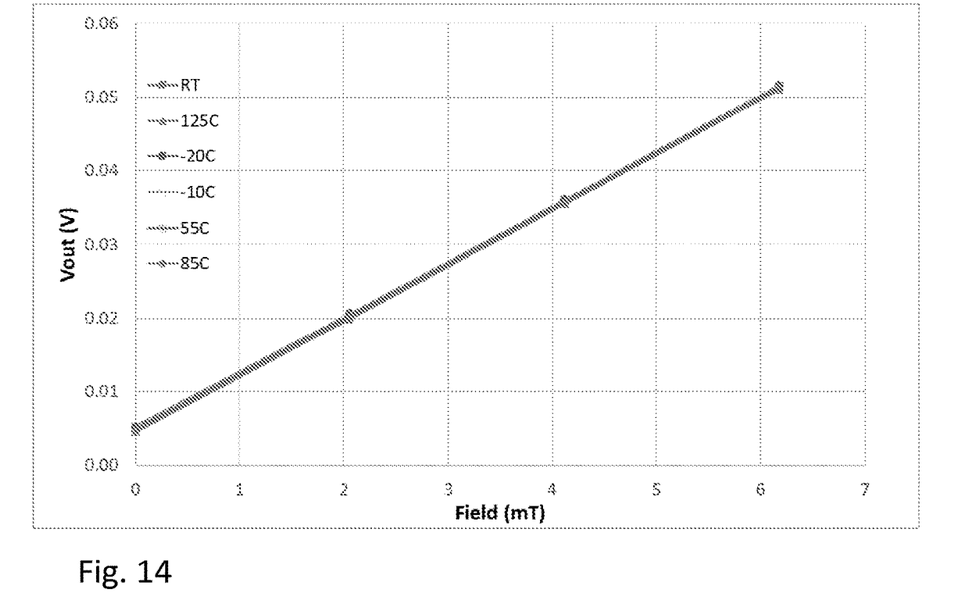
FIG. 14 shows response curves of the MTJ sensing circuit, wherein the bias voltage is modulated with temperature.

FIG. 14 shows response curves of the MTJ sensing circuit 100 measured in the linear portion at room temperature RT, 125° C., 55° C., 85° C., −10° C., and −20° C., wherein the bias voltage $V_{bias}$ is modulated with temperature in accordance to the method disclosed herein. FIG. 8 shows significant improvement in the temperature compensation behavior of sensitivity observed using the MTJ sensing circuit 100 and the method disclosed herein.

It is understood that the present invention is not limited to the exemplary embodiments described above and other examples of implementations are also possible within the scope of the patent claims.

For example, the method of the invention can be used to perform similar temperature correction for other type sensors that have a predictable temperature coefficient.

REFERENCE NUMBERS AND SYMBOLS

10 MTJ sensing element
100 MTJ sensing circuit
101 input
102 output
2 magnetic tunnel junction
21 sense ferromagnetic layer
210 sense magnetization
22 tunnel barrier layer
23 pinned ferromagnetic layer
230 pinned magnetization
250 sensing axis
30 correction temperature signal
300 correction circuit
301 temperature sensor
302 bias voltage control circuit
303 analog front-end amplifier
311 comparator
312 comparators
315 array-based memory cell
H external magnetic field
LP linear portion
T temperature
$V_{bias}$ bias voltage
$V_{bias}(T)$ modulated bias voltage
$V_{out}$ output voltage
$V_{Ref}$ voltage reference

The invention claimed is:

1. MTJ sensing circuit for measuring an external magnetic field and comprising a plurality of MTJ sensor elements connected in a bridge configuration, the MTJ sensing circuit having an input for inputting a bias voltage and generating an output voltage proportional to the external magnetic field multiplied by the bias voltage and a gain sensitivity of the MTJ sensing circuit, wherein the gain sensitivity and the output voltage vary with temperature;

the MTJ sensing circuit further comprising a temperature compensation circuit configured to provide a modulated bias voltage that varies as a function of temperature over a temperature range, such that the output voltage is substantially constant as a function of temperature;

wherein the temperature compensation circuit is configured for generating a plurality of reference voltages, each reference voltage corresponding to a temperature subrange of the temperature range;

wherein the temperature compensation circuit further comprises a plurality of subrange resistors configured to generate a temperature dependent voltage for each subrange resistor, when a temperature dependent proportional-to-absolute-temperature (PTAT) current is forced in the plurality of subrange resistors;

the temperature compensation circuit further comprises a plurality of comparators configured to compare temperature dependent voltages to a plurality of fixed voltage references, each comparator generating a hysteresis comparator output;

the temperature compensation circuit further comprises an array-based memory cell having a plurality of registers, each register representing a bias voltage corresponding to one of the temperature subranges, the array-based memory cell being configured to select one of the register depending on the hysteresis comparator output.

2. The MTJ sensing circuit according to claim 1, wherein the temperature compensation circuit comprises a temperature sensor circuit configured for measuring said gain sensitivity over said temperature range.

3. The MTJ sensing circuit according to claim 1, wherein each temperature subrange has a temperature span of about 10° C. or larger.

4. The MTJ sensing circuit according to claim 1, wherein said temperature range extends from −40° C. to 125° C.

5. The MTJ sensing circuit according to claim 1, wherein said temperature subranges comprise a temperature subrange below 25° C. and a temperature subrange from 25° C. or above.

6. Method for compensating an output voltage of a MTJ sensing circuit comprising a plurality of MTJ sensor elements connected in a bridge configuration, the MTJ sensing circuit having an input for inputting a bias voltage and generating an output voltage proportional to the external magnetic field multiplied by the bias voltage and a gain sensitivity of the MTJ sensing circuit, wherein the gain sensitivity and the output voltage vary with temperature; the MTJ sensing circuit further comprising a temperature compensation circuit configured to provide a modulated bias voltage that varies as a function of temperature over a temperature range;

wherein the temperature compensation circuit further comprises a plurality of subrange resistors configured to pass a PTAT current, a plurality of comparators, and an array-based memory cell having a plurality of registers, each register representing a bias voltage corresponding to one of the temperature subranges;

the method comprising:

measuring temperature of the MTJ sensing circuit;

using the temperature compensation circuit to modulate the bias voltage with temperature such that the modulated bias voltage multiplied by the gain sensitivity is constant; comprising:

using the temperature compensation circuit to generate a plurality of reference voltages, each reference voltage corresponding to a temperature subrange of the temperature range;

generating a temperature dependent voltage for each subrange resistor, by forcing the PTAT current in the plurality of subrange resistors;

using the plurality of comparators to compare temperature dependent voltages to a plurality of fixed voltage references, and generating a hysteresis comparator output for each comparator; and using the array-based memory cell to select one of the register depending on the hysteresis comparator output.

* * * * *

UNITED STATES PATENT AND TRADEMARK OFFICE
CERTIFICATE OF CORRECTION

PATENT NO. : 11,971,463 B2
APPLICATION NO. : 17/905214
DATED : April 30, 2024
INVENTOR(S) : Anuraag Mohan et al.

Page 1 of 2

It is certified that error appears in the above-identified patent and that said Letters Patent is hereby corrected as shown below:

In the Drawings

Sheet 1, FIG. 1, the first reference number 22 designating a pinned magnetization 230 is replaced with the reference number 23 as shown on the attached drawing sheet.

Sheet 1, FIG. 1, the third reference number 22 designating a sense magnetization 210 is replaced with the reference number 21 as shown on the attached drawing sheet.

In the Specification

Column 2, Line 28, delete "mV/mTN bias." and replace with --mV/mT/$V_{bias}$.--.

Signed and Sealed this
Eleventh Day of February, 2025

Coke Morgan Stewart
*Acting Director of the United States Patent and Trademark Office*

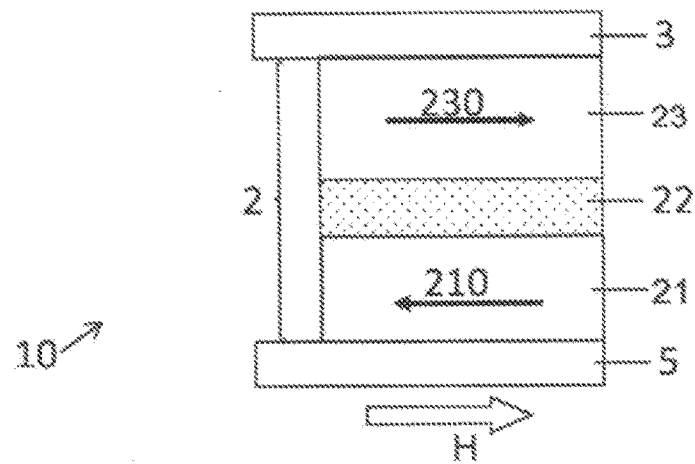
Fig. 1